United States Patent
Kabe et al.

(10) Patent No.: US 9,318,471 B2
(45) Date of Patent: Apr. 19, 2016

(54) SEMICONDUCTOR DEVICE AND METHOD FOR FABRICATING THE SAME

(71) Applicant: PANASONIC INTELLECTUAL PROPERTY MANAGEMENT CO., LTD., Osaka (JP)

(72) Inventors: Tatsuya Kabe, Toyama (JP); Hideyuki Arai, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/920,289

(22) Filed: Oct. 22, 2015

(65) Prior Publication Data

US 2016/0043060 A1 Feb. 11, 2016

Related U.S. Application Data

(63) Continuation of application No. PCT/JP2014/000855, filed on Feb. 19, 2014.

(30) Foreign Application Priority Data

May 16, 2013 (JP) ................................. 2013-104276

(51) Int. Cl.
*H01L 21/00* (2006.01)
*H01L 25/065* (2006.01)
(Continued)

(52) U.S. Cl.
CPC ...... *H01L 25/0657* (2013.01); *H01L 21/76898* (2013.01); *H01L 23/5223* (2013.01); *H01L 23/5227* (2013.01); *H01L 24/08* (2013.01); *H01L 24/80* (2013.01);
(Continued)

(58) Field of Classification Search
CPC ..................... H01L 25/0657; H01L 21/76898; H01L 23/5223; H01L 23/5227; H01L 24/08; H01L 24/80; H01L 27/0688
See application file for complete search history.

(56) References Cited

U.S. PATENT DOCUMENTS 7,521,786 B2 * 4/2009 Kitabatake ............ H01L 25/074
257/686
2004/0157407 A1 8/2004 Tong et al.
(Continued)

FOREIGN PATENT DOCUMENTS

JP 2006-517344 A 7/2006
JP 2007-43172 A 2/2007
(Continued)

OTHER PUBLICATIONS

International Search Report dated, May 13, 2014 received in International Application No. PCT/JP2014/000855 (English Translation provided).

*Primary Examiner* — Nicholas Tobergte
(74) *Attorney, Agent, or Firm* — McDermott Will & Emery LLP

(57) ABSTRACT

A semiconductor device includes: a first substrate including a first surface layer that includes first and second electrodes; a second substrate including a second surface layer that includes third and fourth electrodes, and directly bonded to the first substrate such that the second surface layer is in contact with the first surface layer; and a functional film provided between the second and fourth electrodes. The first and third electrodes are bonded together so as to be in contact with each other, and the second electrode, the functional film, and the fourth electrode constitute a passive element.

9 Claims, 8 Drawing Sheets

(51) Int. Cl.
   *H01L 23/00*     (2006.01)
   *H01L 27/06*     (2006.01)
   *H01L 23/522*    (2006.01)
   *H01L 21/768*    (2006.01)
   *H01L 49/02*         (2006.01)

(52) U.S. Cl.
   CPC ............ *H01L 27/0688* (2013.01); *H01L 24/05* (2013.01); *H01L 28/20* (2013.01); *H01L 28/40* (2013.01); *H01L 2224/05568* (2013.01); *H01L 2224/05571* (2013.01); *H01L 2224/05624* (2013.01); *H01L 2224/05647* (2013.01); *H01L 2224/05655* (2013.01); *H01L 2224/05684* (2013.01); *H01L 2224/0603* (2013.01); *H01L 2224/06051* (2013.01); *H01L 2224/08145* (2013.01); *H01L 2224/80097* (2013.01); *H01L 2224/80201* (2013.01); *H01L 2224/80357* (2013.01); *H01L 2224/80895* (2013.01); *H01L 2224/80896* (2013.01); *H01L 2224/9202* (2013.01); *H01L 2225/06513* (2013.01); *H01L 2225/06541* (2013.01); *H01L 2924/01013* (2013.01); *H01L 2924/01015* (2013.01); *H01L 2924/01027* (2013.01); *H01L 2924/01028* (2013.01); *H01L 2924/01029* (2013.01); *H01L 2924/0132* (2013.01); *H01L 2924/01047* (2013.01); *H01L 2924/01074* (2013.01); *H01L 2924/0534* (2013.01); *H01L 2924/05042* (2013.01); *H01L 2924/0549* (2013.01); *H01L 2924/05442* (2013.01)

(56) References Cited

U.S. PATENT DOCUMENTS

| | | |
|---|---|---|
| 2005/0161795 A1 | 7/2005 | Tong et al. |
| 2007/0029646 A1* | 2/2007 | Voldman ................. H01L 23/60 257/662 |
| 2010/0314757 A1* | 12/2010 | Sugiyama ............. H01L 21/486 257/737 |
| 2010/0330742 A1* | 12/2010 | Sugiyama ......... H01L 23/49833 438/107 |
| 2011/0309881 A1 | 12/2011 | Yasuda et al. |
| 2013/0037965 A1* | 2/2013 | Morimoto ........... H01L 23/5286 257/774 |

FOREIGN PATENT DOCUMENTS

| | | |
|---|---|---|
| JP | 2010-226008 A | 10/2010 |
| JP | 2011-211236 A | 10/2011 |
| WO | 2012/157167 A1 | 11/2012 |

\* cited by examiner

SEMICONDUCTOR DEVICE AND METHOD FOR FABRICATING THE SAME

CROSS-REFERENCE TO RELATED APPLICATIONS

This is a continuation of International Application No. PCT/JP2014/000855 filed on Feb. 19, 2014, which claims priority to Japanese Patent Application No. 2013-104276 filed on May 16, 2013. The entire disclosures of these applications are incorporated by reference herein.

BACKGROUND

The present disclosure relates to a semiconductor device and a method for fabricating the same, and more particularly relates to a stacked semiconductor device and a method for fabricating the same.

With recently enhanced function and performance of electronic devices, various studies have been conducted to increase the performance and degree of integration of semiconductor devices for use in electronic devices. Attention has been given, in particular, to three-dimensional stacked semiconductor devices each including a plurality of stacked semiconductor chips. In a three-dimensional stacked semiconductor device, it is significant to electrically connect two or more semiconductor chips together.

A technique in which bumps made of a metal are fusion bonded together has been known as a technique for electrically connecting two or more semiconductor chips together. However, if bumps are fusion bonded together, the bumps are deformed, which may result in a short circuit between the bumps. In addition, while semiconductor chips to be stacked are usually aligned at room temperature, bumps are fusion bonded together at high temperatures around 200° C. Thus, the difference in coefficient of thermal expansion (CTE) between a bonding device and the semiconductor chips warps semiconductor chips. As a result, the semiconductor chips are inevitably misaligned by several micrometers. This makes it difficult to further reduce the pitch between the bumps that are fusion bonded together.

Studies have been conducted on direct bonding of two semiconductor chips as a new bonding technique substituted for the technique for fusion bonding of bumps (see, for example, United States Patent Application Publication No. 2005/0161795). Specific examples of studied processes for directly bonding two semiconductor chips together include a process in which the surfaces of the semiconductor chips are cleaned to form dangling bonds, and the formed dangling bonds are covalently bonded together, a process in which the same metals are metallically bonded together, and a process in which an $NH_x$ group, an OH group, or any other appropriate group is attached to the surfaces to hydrogen bond the semiconductor chips together.

Semiconductor chips can be directly bonded together at lower temperatures than those at which bumps are fusion bonded together. Thus, the pitch between electrodes can be shorter than that obtained if bumps are fusion bonded together. While the foregoing technique is generally referred to as, for example, room temperature bonding or direct bonding, it is referred to as direct bonding in this specification.

In some cases, a semiconductor chip includes not only an active element such as a transistor, but also a passive element such as a resistance element, a capacitor element, and an inductor element. A passive element is generally provided in an interconnect layer. In order to provide a three-dimensional stacked semiconductor device including a passive element by direct bonding, it is suitable to form the passive element in an interconnect layer of one of semiconductor chips of the semiconductor device (see, for example, Japanese Unexamined Patent Publication No. 2011-211236).

SUMMARY

However, the conventional three-dimensional stacked semiconductor device requires new process steps for providing a passive element. A metal-insulator-metal (MIM) capacitor element, for example, includes a lower electrode, a capacitor insulating film, and an upper electrode. For this reason, to form the MIM capacitor element, lithography, etching, and planarization theoretically need to be each performed three times. Even if it is possible to collectively form the lower electrode together with a usual interconnect, process steps for the capacitor insulating film and the upper electrode need to be added. A via plug passing through an additional layer further needs to be provided in a portion of the semiconductor chip including no MIM capacitor element so as to lead an electrode to the outermost surface of this portion. Thus, the provision of the passive element increases the number of process steps for fabricating the semiconductor chip and the fabrication cost.

It is an object of the present disclosure to provide a three-dimensional stacked semiconductor device including a passive element formed through a minimized number of additional process steps, and a method for fabricating the same.

A semiconductor device according to an aspect of the present disclosure includes: a first substrate including a first substrate body, and a first surface layer that is provided over a principal surface of the first substrate body, and includes a first surface film, a first electrode having a first surface exposed at an outermost surface of the first surface film, and a second electrode having a second surface exposed at the outermost surface of the first surface film; a second substrate including a second substrate body, and a second surface layer that is provided over a principal surface of the second substrate body, and includes a second surface film, a third electrode having a third surface exposed at an outermost surface of the second surface film, and a fourth electrode having a fourth surface exposed at the outermost surface of the second surface film, where the second substrate is directly bonded to the first substrate such that the second surface layer is in contact with the first surface layer; and a functional film provided between the second surface of the second electrode and the fourth surface of the fourth electrode. The first surface of the first electrode and the third surface of the third electrode are bonded together so as to be in contact with each other, and the second electrode, the functional film, and the fourth electrode constitute a passive element.

In the semiconductor device according to the aspect, a size of the functional film in plan view may be greater than each of a size, in plan view, of a portion of the second electrode exposed from the first surface film and a size, in plan view, of a portion of the fourth electrode exposed from the second surface film.

In the semiconductor device according to the aspect, the functional film may be an insulating film, and the second electrode, the functional film, and the fourth electrode may constitute a capacitor element.

In this case, the functional film may be made of $SiO_x$, $SiN_x$, $HfO_x$, or $HfSiO_x$.

In the semiconductor device according to the aspect, the functional film may be a film made of a high-resistance metal, and the second electrode, the functional film, and the fourth electrode may constitute a resistance element.

In this case, the high-resistance metal may be constantan, nickel silver, cobalt-tungsten-phosphorus (Co—W—P), or nickel boron (Ni—B).

In the semiconductor device according to the aspect, the first, second, third, and fourth electrodes may be each made of aluminum, copper, nickel, or tungsten.

In the semiconductor device according to the aspect, the first substrate may include a first through electrode passing through the first substrate body.

In the semiconductor device according to the aspect, the second substrate may include a second through electrode passing through the second substrate body.

A method for fabricating a semiconductor device according to another aspect of the present disclosure includes: preparing a first substrate including a first substrate body, and a first surface layer that is provided over a principal surface of the first substrate body, and includes a first surface film, a first electrode, and a second electrode; preparing a second substrate including a second substrate body, and a second surface layer that is provided over a principal surface of the second substrate body, and includes a second surface film, a third electrode, and a fourth electrode; selectively forming a functional film to cover the second electrode; treating a surface of the first substrate over which the functional film is formed, and a surface of the second substrate; and after the treating, directly bonding the first and second substrates together while bringing the first surface layer into contact with the second surface layer. In the directly bonding, the first and third electrodes are bonded together so as to be in contact with each other, and a passive element comprised of the second electrode, the functional film, and the fourth electrode is formed.

In the method of the another aspect, the preparing of the first substrate may include: forming the first surface film over the first substrate body; forming openings in predetermined portions of the first surface film; forming the first and second electrodes by filling the openings of the first surface film with a conductive film; and planarizing the first surface film, and the first and second electrodes, and the preparing of the second substrate may include: forming the second surface film over the second substrate body; forming openings in predetermined portions of the second surface film; forming the third and fourth electrodes by filling the openings of the second surface film with a conductive film; and planarizing the second surface film, and the third and fourth electrodes.

In the method according to the another aspect, the treating may include cleaning the surfaces of the first and second substrates by wet cleaning, or may include exposing the surfaces of the first and second substrates to plasma.

In the method according to the another aspect, in the selectively forming of the functional film, an insulating film may be formed as the functional film. Alternatively, in the selectively forming of the functional film, a film made of a high-resistance metal may be formed as the functional film.

According to the present disclosure, a three-dimensional stacked semiconductor device including a passive element formed through a minimized number of additional process steps and a method for fabricating the same are provided.

DETAILED DESCRIPTION

In the present disclosure, the phrase "A is provided (or formed) 'over' B" encompasses both a situation where a member is provided between A and B and a situation where A and B are in contact with each other.

Figure 1:
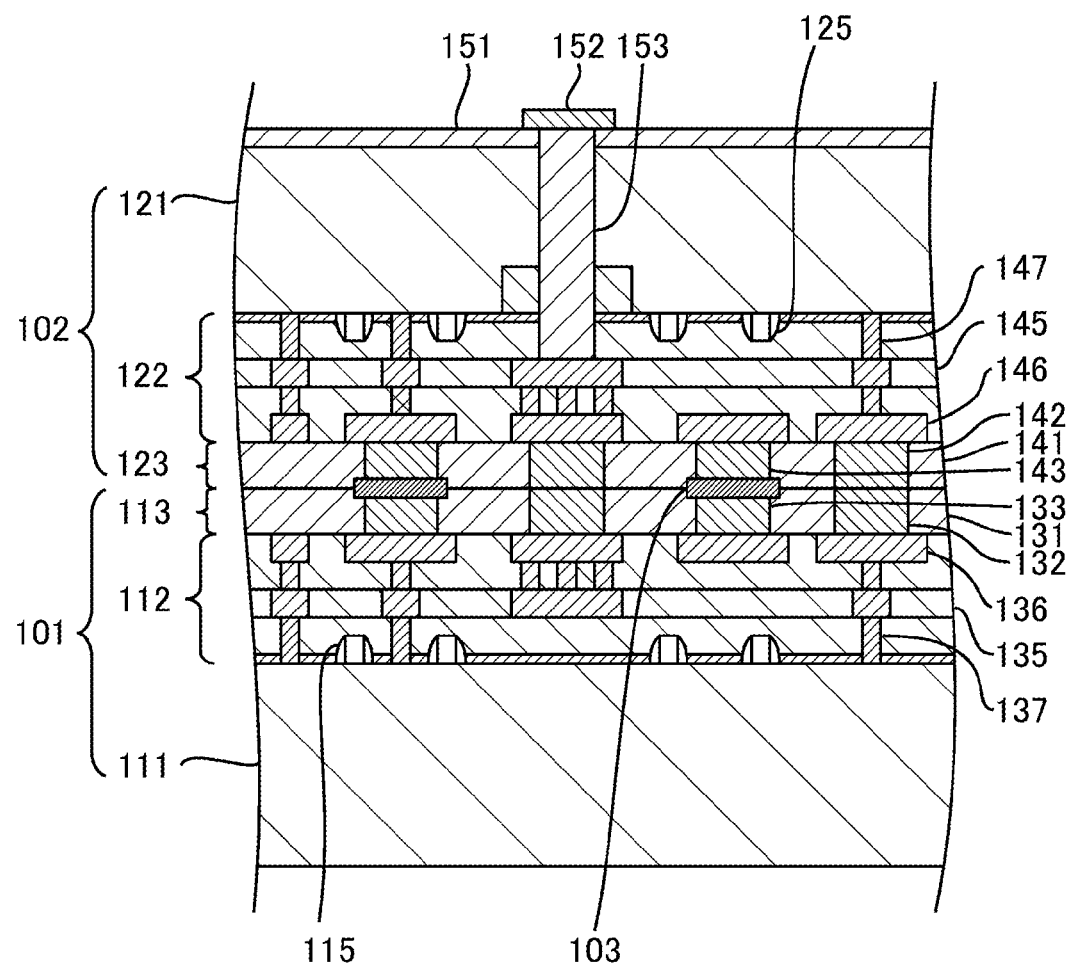
FIG. 1 is a cross-sectional view illustrating a semiconductor device according to an embodiment.

As illustrated in FIG. 1, a semiconductor device according to this embodiment is a three-dimensional stacked semiconductor device including first and second substrates 101 and 102 that are stacked. The first substrate 101 includes a first substrate body 111 such as a silicon substrate, a first interconnect layer 112 provided over the principal surface of the first substrate body 111, and a first surface layer 113 provided over the first interconnect layer 112. The second substrate 102 includes a second substrate body 121 such as a silicon substrate, a second interconnect layer 122 provided over the principal surface of the second substrate body 121, and a second surface layer 123 provided over the second interconnect layer 122.

The first surface layer 113 includes a first surface film 131 that is an insulating film, first electrodes 132 each having a first surface exposed at the outermost surface of the first surface film 131, and second electrodes 133 each having a second surface exposed at the outermost surface of the first surface film 131. The second surface layer 123 includes a second surface film 141 that is an insulating film, third electrodes 142 each having a third surface exposed at the outermost surface of the second surface film 141, and fourth electrodes 143 each having a fourth surface exposed at the outermost surface of the second surface film 141. The first and second substrates 101 and 102 are directly bonded together such that the first and second surface layers 113 and 123 are brought into contact with each other. Specifically, the first and second surface films 131 and 141 are bonded together so as to be in contact with each other without an adhesive or any other component interposed therebetween. Each first electrode 132 and an associated one of the third electrodes 142 are also bonded together so as to be in contact each other without an adhesive or any other component interposed therebetween, and are also electrically continuous. Each second electrode 133 and an associated one of the fourth electrodes 143 are bonded together with an associated one of functional films 103 interposed therebetween. Each second electrode 133, the associated functional film 103, and the associated fourth electrode 143 constitute a passive element, such as a MIM capacitor element.

The term "direct bonding" in this specification means that two smooth surfaces are bonded together using the attractive forces between the surfaces without an adhesive member or any other member interposed therebetween, and encompasses not only a situation where the same materials are bonded together, but also a situation where different materials are bonded together. In this embodiment, the functional films 103 reside partially between the first and second substrates 101 and 102. However, since an adhesive member, such as an adhesive, solder, or an adhesive layer, does not reside between the first and second surface layers 113 and 123, the first and second substrates 101 and 102 thus provided are described as "directly bonded together" in this specification.

In FIG. 1, the first substrate body 111 is provided with circuit elements such as transistors 115. The first interconnect layer 112 includes a first interlayer film 135 that is an insulating film, first conductive films 136, and contact plugs 137. The first conductive films 136 constitute an interconnect, a pad, a via plug, and other components. The first interlayer film 135 and the first conductive films 136 may be each a combination of a plurality of films. The first conductive films 136 are connected to one or more of the transistors 115 and other components via associated ones of the contact plugs 137. Furthermore, the first conductive films 136 are each connected to an associated one of the first and second electrodes 132 and 133.

In FIG. 1, the second substrate body 121 is provided with circuit elements such as transistors 125. The second interconnect layer 122 includes a second interlayer film 145, second conductive films 146, and contact plugs 147. The second conductive films 146 constitute an interconnect, a pad, a via plug, and any other component. The second interlayer film 145 and the second conductive films 146 may be each a combination of a plurality of films. The second conductive films 146 are connected to one or more of the transistors 125 and other components via associated ones of the contact plugs 147. Furthermore, the second conductive films 146 are each connected to an associated one of the third and fourth electrodes 142 and 143.

Examples of the material for each of the first and second interlayer films 135 and 145 include silicon oxide ($SiO_x$), silicon nitride ($SiN_x$), carbon-containing silicon nitride ($SiC_xN_y$), carbon-containing silicon oxide ($SiC_xO_y$), and methyl siloxane ($SiO_x(CH_3)_y$). The first and second conductive films 136 and 146 are each made of a low-resistance metal, such as copper, aluminum, or silver. Diffusion barrier layers made of a high-melting-point metal, such as tantalum, titanium, cobalt, manganese, zircon, or a nitride thereof, may be provided between the first conductive films 136 and the first interlayer film 135 and between the second conductive films 146 and the second interlayer film 145. The provision of the diffusion barrier layers can prevent the metal material constituting the conductive films from diffusing into the interlayer films, and improve the adhesion between the conductive films and the interlayer film.

The first and second interlayer films 135 and 145 may be made of the same material or different materials. If the first and second interlayer films 135 and 145 each include a plurality of subfilms, the subfilms may be made of the same material or different materials. The first and second conductive films 136 and 146 may be made of the same material or different materials. If the first and second conductive films 136 and 146 each include a plurality of subfilms, the subfilms may be made of the same material or different materials.

The first surface film 131 constituting a portion of the first surface layer 113 and the second surface film 141 constituting a portion of the second surface layer 123 are each made of a silicon compound, such as $SiO_x$, $SiN_x$, or $SiO_xN_y$, or an organic film of benzocyclobutene (BCB), polybenzoxazole (PBO), polyimide (PI), or any other organic material. The first and second surface films 131 and 141 may have a thickness of about 100 nm to 10 μm. The first and second surface films 131 and 141 may be made of the same material or different materials.

The first and second electrodes 132 and 133 constituting portions of the first surface layer 113 and the third and fourth electrodes 142 and 143 constituting portions of the second surface layer 123 are each made of, for example, copper, aluminum, nickel, or tungsten. The size, in plan view, of a portion of each of the first, second, third, and fourth electrodes 132, 133, 142, and 143 exposed from an associated one of the first and second surface films 131 and 141 may be about 100 $nm^2$ to 10 $μm^2$. Diffusion barrier layers made of a high-melting-point metal, such as tantalum, titanium, cobalt, manganese, zircon, or a nitride thereof, may be provided between the first surface film 131 and the first and second electrodes 132 and 133 and between the second surface film 141 and the third and fourth electrodes 142 and 143. The diffusion barrier layers may have a thickness of 100 nm or less. The first, second, third, and fourth electrodes 132, 133, 142, and 143 may be made of the same material or different materials.

If it is intended that the passive element comprised of the second electrode 133, the functional film 103, and the fourth electrode 143 should be a MIM capacitor element, the functional film 103 is suitably a capacitor insulating film. Specifically, the functional film 103 is suitably a high dielectric constant material film made of a high dielectric constant material, such as hafnium oxide ($HfO_x$), hafnium silicon oxide ($HfSiO_x$), or $SiN_x$.

If it is intended that the passive element comprised of the second electrode 133, the functional film 103, and the fourth electrode 143 should be a resistance element, the functional film 103 is suitably a high-resistance metal film made of a high-resistance metal, such as constantan that is an alloy of copper and nickel, nickel silver that is an alloy of copper, zinc, and nickel, cobalt tungsten phosphorus (Co—W—P) that is an alloy of phosphorus-containing cobalt and tungsten, or nickel boron (Ni—B).

The functional film 103 may have a thickness of about 1-20 nm. Such a thickness facilitates directly bonding the first and second substrates 101 and 102 together. The size of the functional film 103 in plan view may be determined in consideration of the characteristics that the passive element needs to have. If the functional film 103 is a high dielectric constant material film, its size in plan view can be about 100 $nm^2$ to 20 $μm^2$. In addition, the size of the functional film 103 in plan view may be greater than that, in plan view, of a portion of an associated one of the second electrodes 133 exposed from the first surface film 131 and that, in plan view, of a portion of an associated one of the fourth electrodes 143 exposed from the second surface film 141, and may cover a portion of each surface film surrounding the associated electrode. By covering, with the functional films 103, portions of the first surface film 131 surrounding the first electrodes 132 and portions of the second surface film 141 surrounding the fourth electrodes 143, diffusion of metal from the second and fourth electrodes 133 and 143 into the first and second surface film 131 and 141 is reduced. It is recommended that the distance from the end of the functional film 103 to an electrode adjacent thereto be long enough to ensure the bond strength between the first and second surface films 131 and 141. The distance from the end of the functional film 103 to the electrode adjacent thereto, for example, can be greater than or equal to 100 nm.

The second substrate 102 includes a protective film 151 provided over a (back) surface of the second substrate body 121 opposite to the principal surface thereof. The protective film 151 is made of, for example, a silicon compound, such as $SiO_x$, $SiN_x$, or $SiO_xN_y$, or an organic film of benzocyclobutene (BCB), polybenzoxazole (PBO), polyimide (PI), or any other organic material. The protective film 151 may have a thickness of about 100 nm to 10 µm. An electrode pad 152 made of aluminum or any other material is provided over the protective film 151. The electrode pad 152 is connected through a through electrode 153 passing through the second substrate body 121 to one of the second conductive films 146 provided in the second interconnect layer 122. The through electrode 153 suitably has a diameter of about 1-200 µm, and may have an aspect ratio of about 1-20. The through electrode 153 can be made of copper, tungsten, polysilicon, or any other material.

In the semiconductor device of this embodiment, some of the electrodes are used as the electrodes of the passive elements. Thus, the only additional step that this embodiment includes in addition to the fabrication process steps for a semiconductor device including no passive element is the step of forming the functional films 103. As can be seen from the foregoing description, in the semiconductor device of this embodiment, a passive element is formed through a minimized number of additional process steps. This allows for stably fabricating a low-cost and high-function three-dimensional stacked semiconductor device including chips each having a small area.

Figure 2:
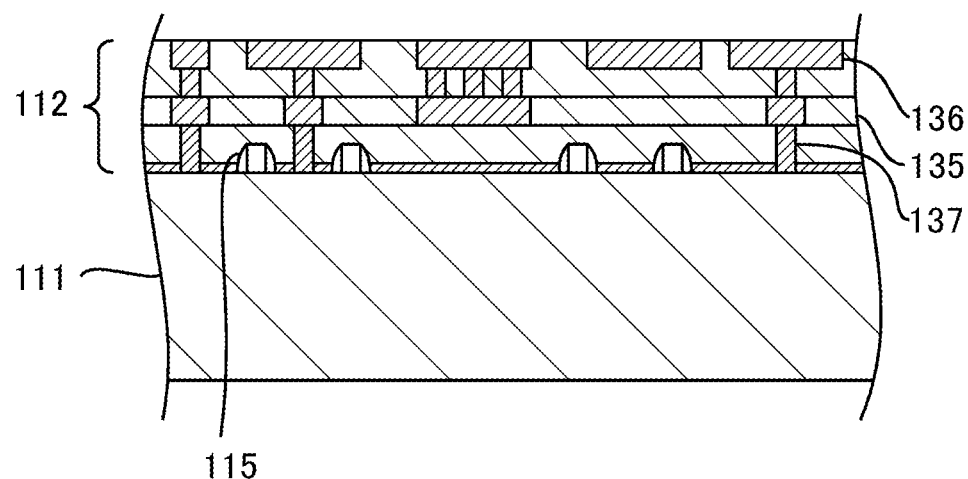
FIG. 2 is a cross-sectional view illustrating a process step in a method for fabricating a semiconductor device according to an embodiment.

The semiconductor device of this embodiment can be fabricated in the following manner. First, as illustrated in FIG. 2, a first substrate body 111 including elements such as transistors 115 is prepared. Thereafter, a first interconnect layer 112 is formed over the principal surface of the first substrate body 111, and made to include a first interlayer film 135, contact plugs 137, first conductive films 136, and other components. The first interconnect layer 112 can be formed, for example, in the following manner. First, after the formation of a first interlayer film covering the transistors 115, contact holes are formed in predetermined portions of the first interlayer film, and the contact holes are filled with conductive films, thereby forming the contact plugs 137. Next, after the formation of a second interlayer film, interconnect grooves are formed in predetermined portions of the second interlayer film. The interconnect grooves are filled with conductive films, thereby forming interconnects. Next, after the formation of a third interlayer film, pad grooves and via holes are formed in predetermined portions of the third interlayer film. The pad grooves and the via holes are filled with conductive films, thereby forming pads and vias each connecting an associated one of the pads to an associated one of the interconnects.

Figure 3:
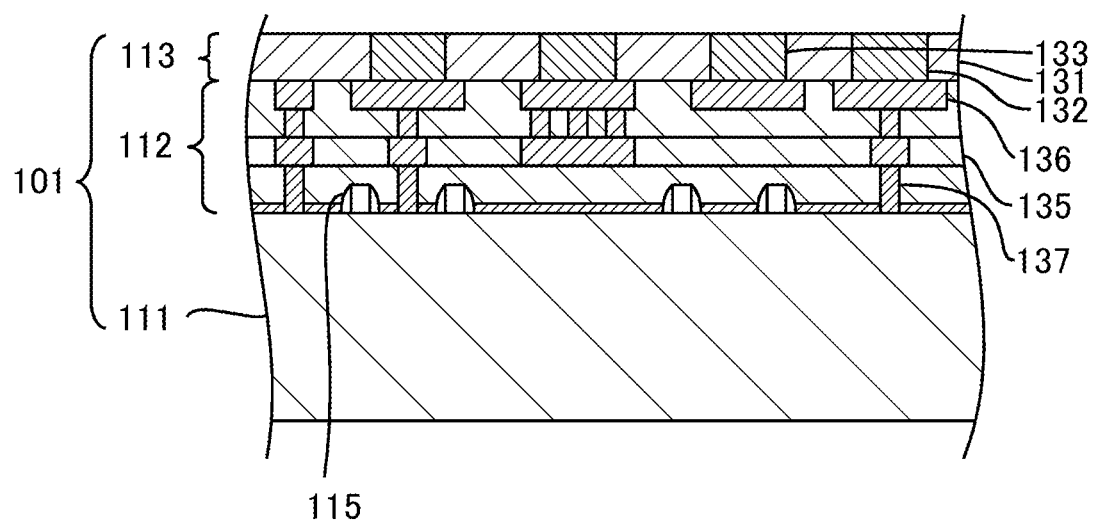
FIG. 3 is a cross-sectional view illustrating another process step in the method for fabricating a semiconductor device according to the embodiment.

Next, as illustrated in FIG. 3, a first surface layer 113 is formed over the first interconnect layer 112. The first surface layer 113 may be formed using an interconnect formation process, such as a damascene process, a semi-additive process, or a stacking process for use to make aluminum interconnects. For the damascene process, the first surface layer 113 can be formed, for example, in the following manner. First, a first surface film 131 made of $SiO_x$, $SiN_x$, $SiO_xN_y$, or any other material is formed over the first interconnect layer 112 by chemical vapor deposition (CVD), application, or any other process. Thereafter, openings are formed in predetermined portions of the first surface film 131 by lithography and etching to expose the pads. Subsequently, a diffusion bather film made of tantalum, tantalum nitride, or any other material, and a copper plated seed layer are sequentially formed in each opening by physical vapor deposition (PVD) or any other process. Next, copper films fills the openings by plating. Then, unnecessary portions of the copper films are removed by chemical mechanical polishing (CMP) or any other process, thereby forming first and second electrodes 132 and 133. The surfaces of the first and second electrodes 132 and 133 are exposed from the first surface film 131.

It is suitable to planarize the surface of the first surface layer 113 when the unnecessary portions of the copper films are removed. The arithmetic average roughness (Ra) of a portion of the first surface film 131 around each of the first and second electrodes 132 and 133 per square micrometer, for example, may be less than or equal to 1 nm. The amount of dishing of each of the first and second electrodes 132 and 133 caused by CMP may be less than or equal to 100 nm.

Figure 4:
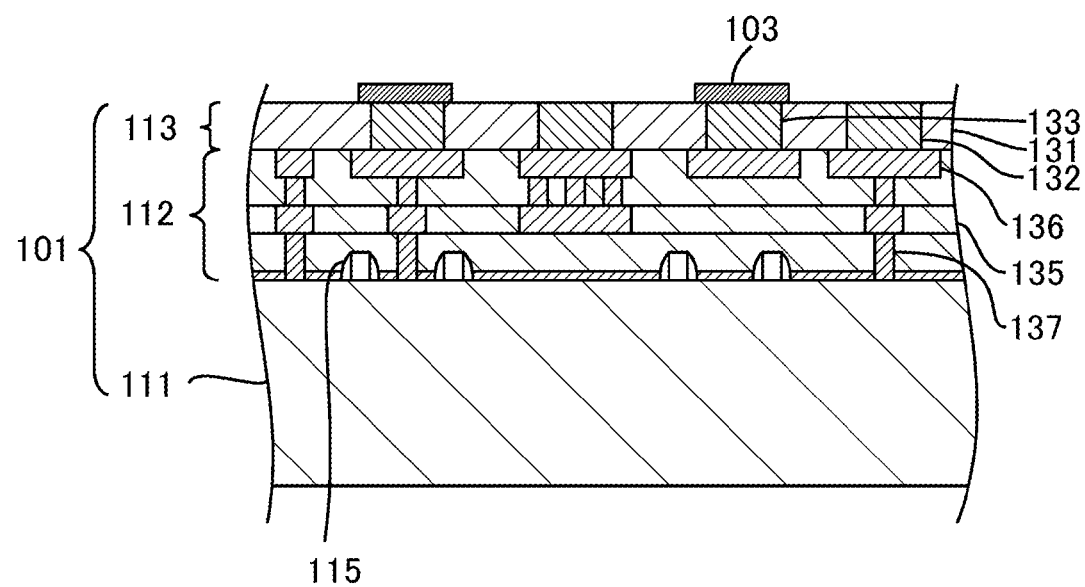
FIG. 4 is a cross-sectional view illustrating still another process step in the method for fabricating a semiconductor device according to the embodiment.

Next, as illustrated in FIG. 4, functional films 103 are selectively formed to cover the second electrodes 133. If MIM capacitor elements are formed as passive elements, a high dielectric constant material film made of $SiN_x$ or any other material is first formed over the first surface layer 113. The high dielectric constant material film may be formed by CVD, for example. The high dielectric constant material film can have a thickness of about 1-20 nm. Thereafter, unnecessary portions of the high dielectric constant material film are removed by lithography and etching, thereby forming the functional films 103 over the second electrodes 133. The size of each functional film 103 in plan view just needs to be greater than that of an associated one of the second electrodes 133 in plan view, and the functional film 103 just needs to cover a portion of the first surface film 131 over and around the associated second electrode 133. The functional film 103 covering the portion of the first surface film 131 over and around the associated second electrode 133 allows for reducing diffusion of copper constituting the associated second electrode 133 into the first surface film 131.

Figure 5:
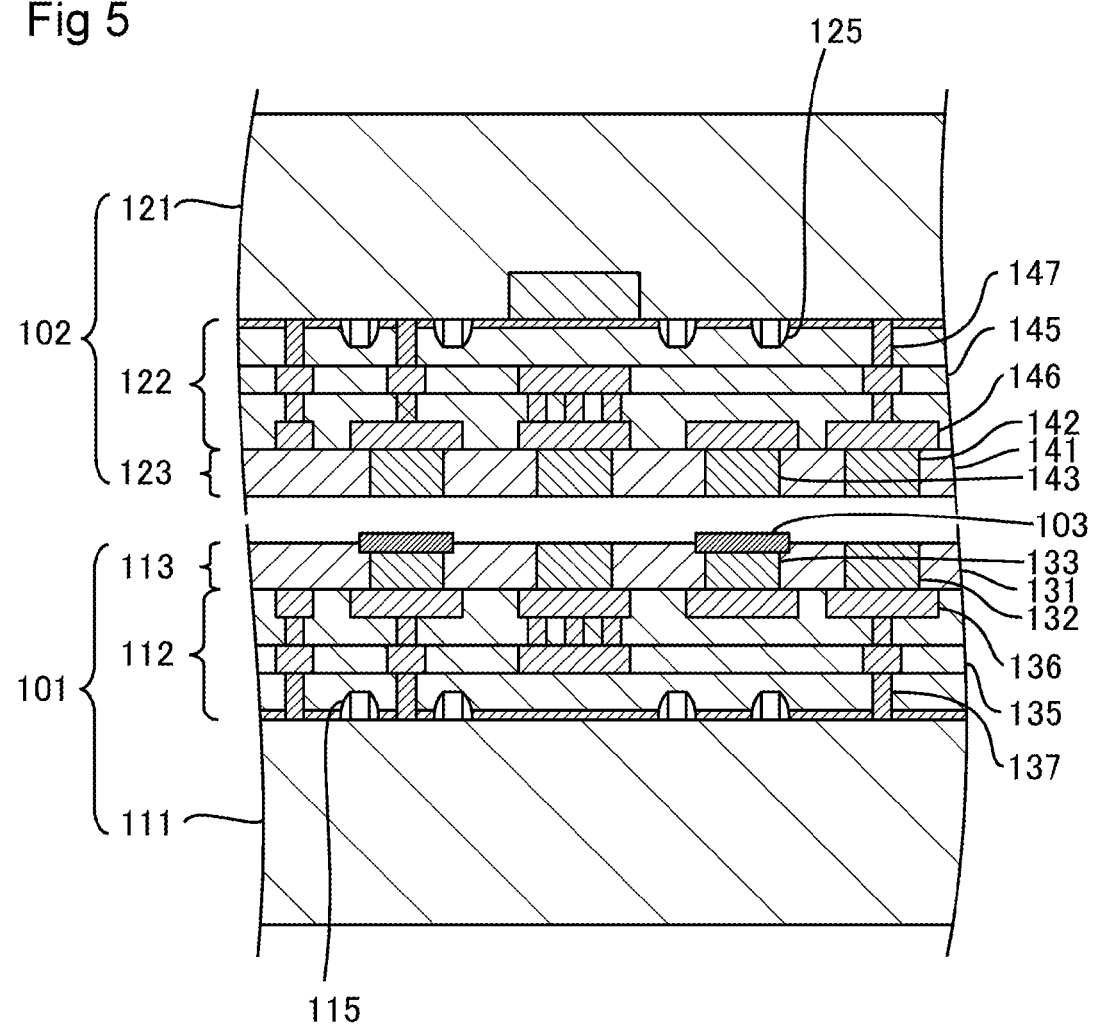
FIG. 5 is a cross-sectional view illustrating yet another process step in the method for fabricating a semiconductor device according to the embodiment.

Next, as illustrated in FIG. 5, a second substrate 102 is prepared in a similar manner to the first substrate 101. Specifically, the second substrate 102 is suitably prepared by forming, over a second substrate body 121, such as a silicon substrate, elements such as transistors 125, a second interconnect layer 122 including a second interlayer film 145 and second conductive films 146, and a second surface layer 123 including a second surface film 141, and third and fourth electrodes 142 and 143. The third electrodes 142 of the second substrate 102 are formed at positions corresponding to those of the first electrodes 132 of the first substrate 101, and the fourth electrodes 143 of the second substrate 102 are formed at positions corresponding to those of the second electrodes 133 of the first substrate 101. The surfaces of the third and fourth electrodes 142 and 143 are exposed from the second surface film 141. The surface of the second surface layer 123 is also planarized like the first surface layer 113.

Figure 6:
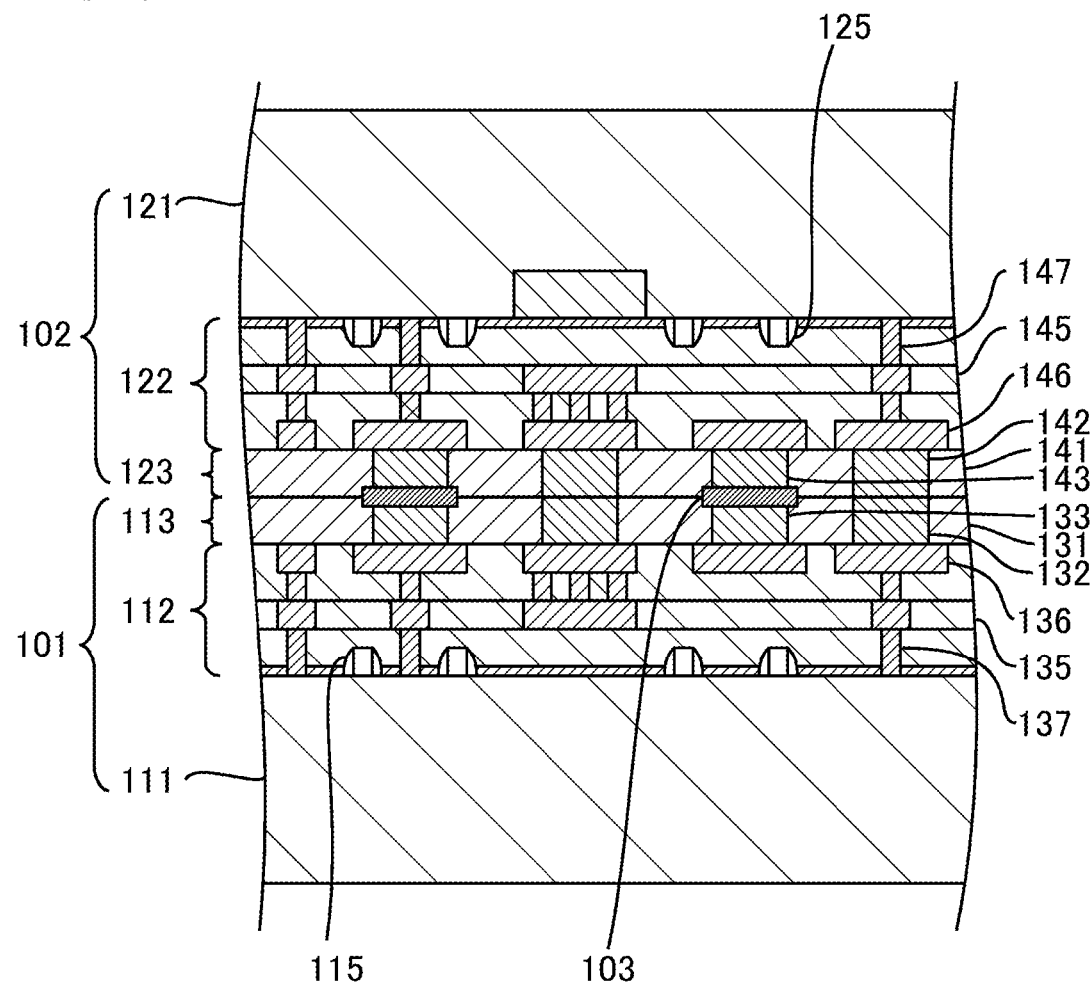
FIG. 6 is a cross-sectional view illustrating a further process step in the method for fabricating a semiconductor device according to the embodiment.

Next, as illustrated in FIG. 6, the first and second substrates 101 and 102 are directly bonded together such that the first and second surface layers 113 and 123 face each other. The first and second substrates 101 and 102 can be directly bonded together in the following manner. First, the surfaces of the first and second surface layers 113 and 123 are treated. To treat the surfaces, cleaning is first performed, and a deposit, a reactant, and any other substance each containing carbon may be removed from the surfaces of the first and second surface layers 113 and 123. This cleaning can be wet cleaning with an ammonia-peroxide mixture (APM). Alternatively, dry cleaning may be performed using plasma, ions, ozone, or any other material. Next, for example, the surfaces of the first and second surface layers 113 and 123 are exposed to oxygen plasma, and the surfaces of the first and second surface films 131 and 141 are terminated with a hydroxyl group (OH group).

Note that the treatment with oxygen plasma or any other material is not essential, and the surfaces of the first and second surface films 131 and 141 can also be terminated with a hydroxyl group (OH group), for example, by forming dangling bonds over these films 131 and 141 and retaining these films 131 and 141 in the air.

After the treatment of the surfaces of the first and second surface layers 113 and 123, the first and second surface layers 113 and 123 are brought into direct contact with each other. Thus, a hydrogen bond is formed between the first and second surface films 131 and 141, and the attractive force induced by the hydrogen bond causes the bond to naturally extend from the interface at which the first and second surface films 131 and 141 initially have come into contact with each other to its surrounding region. Since the cleaned surfaces, made of the same metal, of the electrodes facing each other are brought into contact with each other, a metallic bond is ideally formed between each first electrode 132 and an associated one of the third electrodes 142. While the functional film 103 resides between the second and fourth electrodes 133 and 143, the functional film 103 is compressed by the second and fourth electrodes 133 and 143, which adhere to each other with the functional film 103 interposed therebetween. If the first and second surface layers 113 and 123 are entirely raised, it becomes easier to directly bond the first and second substrates 101 and 102 together.

Thereafter, heat treatment is performed at temperatures of 400° C. or less. The first, second, third, and fourth electrodes 132, 133, 142, and 143 have a higher linear expansion coefficient than the first and second surface films 131 and 141 and the functional films 103. For this reason, the first electrode 132 is more firmly pressure-bonded to the third electrode 142 by heat treatment, and the second and fourth electrodes 133 and 143 more strongly compress the functional film 103. Thus, if the functional film 103 is a high dielectric constant material film, the second and fourth electrodes 133 and 143 and the functional film 103 are bonded together by thermocompression bonding. Furthermore, elements are more easily diffused at each of the contact surfaces between the functional film 103 and the second and fourth electrodes 133 and 143. This further increases the connection strength therebetween. Furthermore, dehydration occurs at the contact surface between the first and second surface films 131 and 141 to strengthen the hydrogen bond, thereby further improving reliability.

The surfaces of the first and second surface films 131 and 141 may be terminated with not a hydroxyl group but an amino group ($NH_2$). Even if the surfaces are terminated with the amino group, a hydrogen bond can be formed between the first and second surface films 131 and 141. If the surfaces are terminated with the amino group, they may be exposed to nitrogen plasma, for example.

Alternatively, dangling bonds may be formed over the surfaces of the first and second surface films 131 and 141 instead of terminating the surfaces of the first and second surface films 131 and 141. In this case, the first and second surface films 131 and 141 can be bonded together by bonding the dangling bonds together. To form the dangling bonds, the surfaces may be exposed to plasma of an inert gas, such as argon, ion beams, or plasma beams.

If the surfaces of the first and second surface films 131 and 141 are terminated with a hydroxyl group, a residue of the hydroxyl group may be found at the interface between the first and second surface films 131 and 141. If the surfaces of the first and second surface films 131 and 141 are terminated with an amino group, a residue of the amino group may be found at the interface between the first and second surface films 131 and 141. If the first and second surface films 131 and 141 are bonded together using dangling bonds, the interface between the first and second surface films 131 and 141 may be unable to be observed.

In the foregoing description, the first and third electrodes 132 and 142 made of the same metal are metallically bonded together. However, this is merely an example of the present disclosure. The first and third electrodes 132 and 142 may be made of different materials, and may be bonded together using intermolecular forces, or may be bonded together using the crystal structures of the metals.

In the foregoing description, the second and fourth electrodes 133 and 143 are bonded to the functional films 103 by thermocompression bonding. However, this is merely an example of the present disclosure. If the functional films 103 are high-resistance metal films or other similar films, the second and fourth electrodes 133 and 143 may be bonded to the functional films 103 by metallic bonding or thermal interdiffusion of elements.

If the functional films 103 are high dielectric constant material films, a portion of the first surface film 131 around each second electrode 133 and a portion of the second surface film 141 around an associated one of the fourth electrodes 143 are bonded to an associated one of the functional films 103 using hydrogen bonds or dangling bonds. If the functional films 103 are high-resistance metal films, a portion of the first surface film 131 around each second electrode 133 and a portion of the second surface film 141 around an associated one of the fourth electrodes 143 are pressure-bonded to an associated one of the functional films 103 due to thermal expansion of the materials, and the functional film 103 is compressed by bonding these portions together, thereby bonding these portions and the functional film 103 together.

Figure 7:
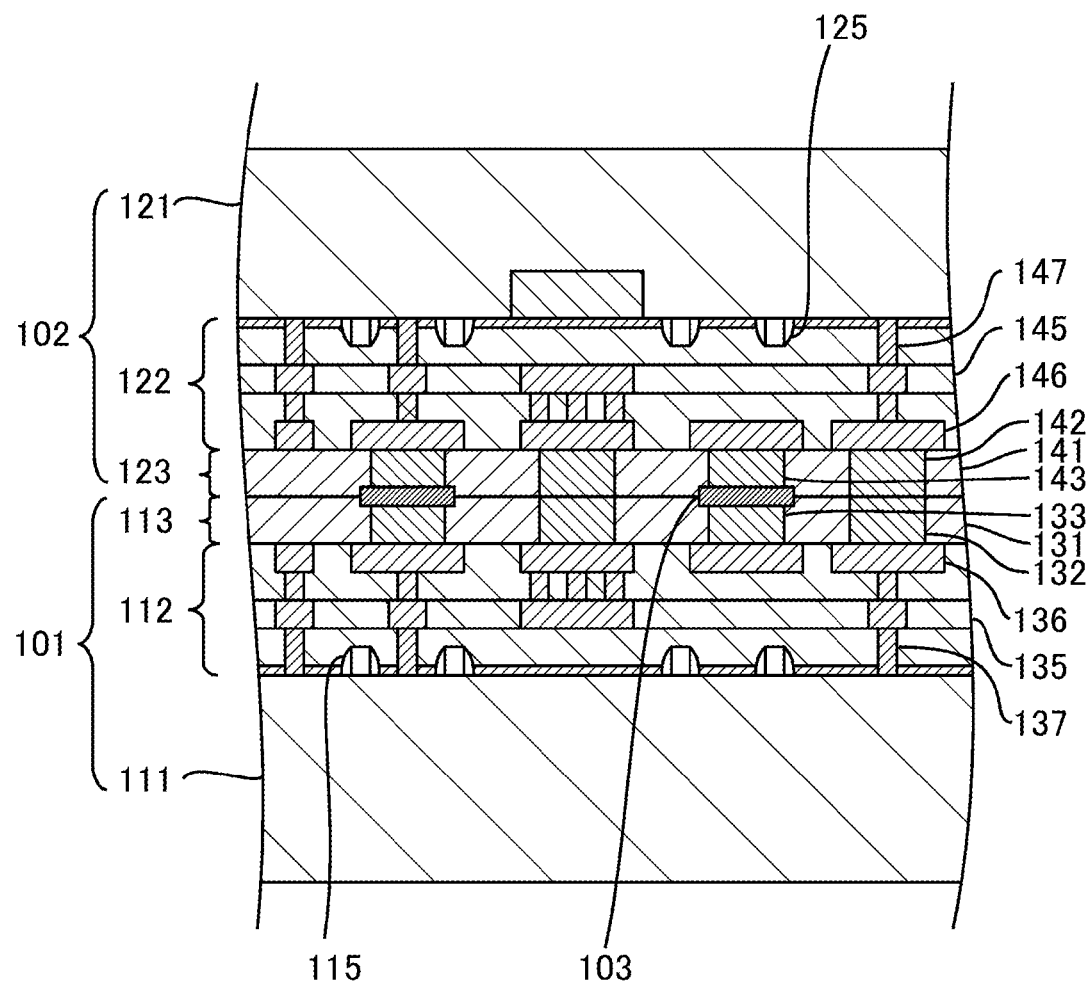
FIG. 7 is a cross-sectional view illustrating a still further process step in the method for fabricating a semiconductor device according to the embodiment.

Next, as illustrated in FIG. 7, the second substrate body 121 is polished from its back surface so as to have a thickness of about 2-200 µm. A grinder or any other tool can be used for polishing.

Figure 8:
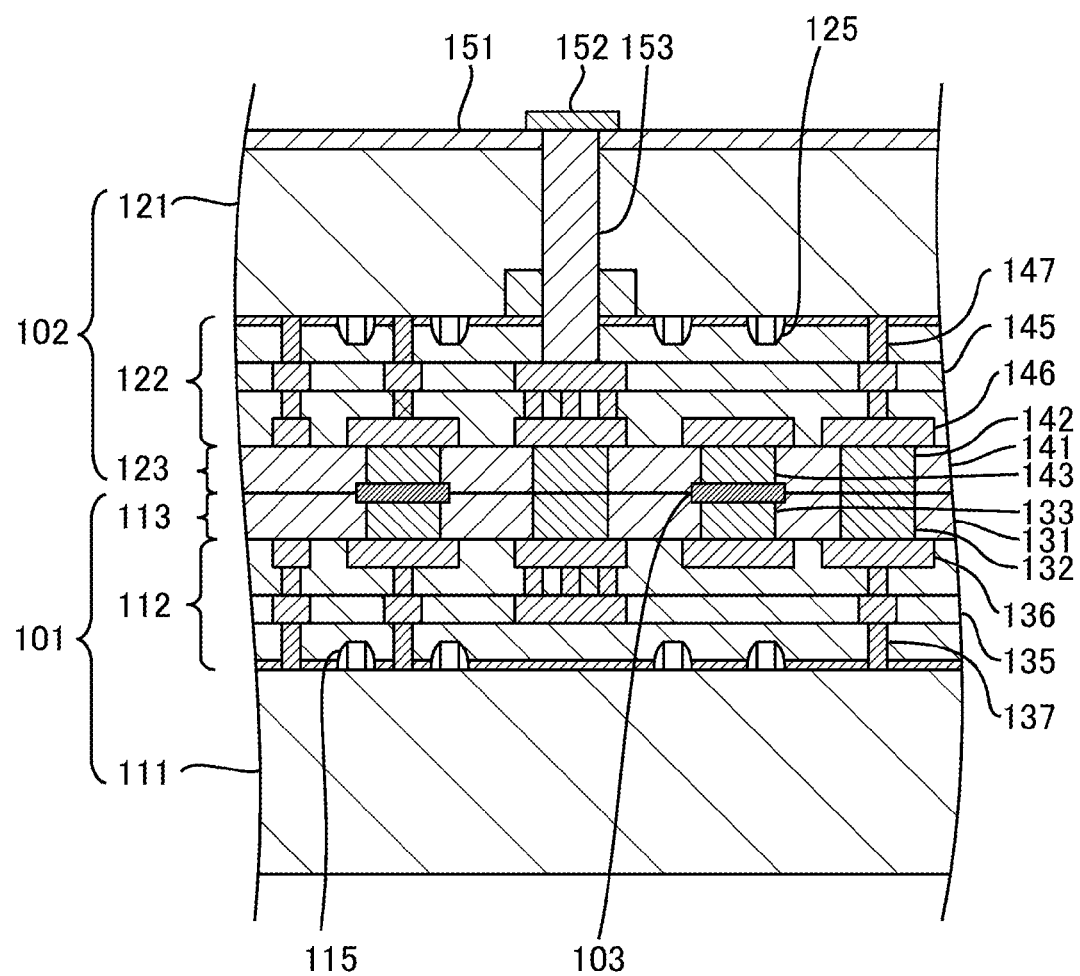
FIG. 8 is a cross-sectional view illustrating a yet further process step in the method for fabricating a semiconductor device according to the embodiment.

Next, as illustrated in FIG. 8, a protective film 151 made of SiN or BCB is formed over the back surface of the second substrate body 121. Thereafter, a through electrode 153 is formed to pass through the second substrate body 121. The through electrode 153 can be formed in the following manner. First, a through hole is formed by lithography and etching to pass through the second substrate body 121. Subsequently, a diffusion barrier film made of tantalum and tantalum nitride and a copper plated seed layer are sequentially formed in the through hole and over the entire back surface of the second substrate body 121 by PVD or any other process. Next, the through hole is filled with a copper film by plating, unnecessary portions of the copper film and diffusion bather film are removed and planarized by CMP, thereby forming a through electrode 153. Then, an electrode pad 152 is formed over the back surface of the second substrate body 121 to be in contact with the through electrode 153. The electrode pad 152 may be formed by forming an aluminum film over the back surface of the second substrate body 121 and then removing an unnecessary portion of the aluminum film by lithography and etching.

Only the single electrode pad 152 and the single through electrode 153 are illustrated. However, a plurality of electrode pads 152 and a plurality of through electrodes 153 can be provided as necessary. Furthermore, the structures of the through electrode 153 and the electrode pad 152 are merely examples, and any material or shape that can ensure electrical continuity therethrough may be used. Instead of copper, polysilicon or tungsten, for example, can be used as the material. To form the through electrode 153, instead of filling the through hole with a conductive material, a conductive material may be formed into a ring in the through hole, and the interior of the ring may be filled with an insulating film. The electrode pad 152 can be connected through a bump to a mounting substrate or any other component. A third substrate can be further stacked. If the third substrate is stacked, direct bonding can also be used instead of the bump. If the third substrate is stacked by direct bonding, a layer including an insulating film and electrodes exposed from the insulating film may be provided also over the back surface of the second substrate body 121, and the surface of the layer may be planarized.

An example in which the electrode pad 152 is provided over the back surface of the second substrate body 121 has been described. However, an electrode pad may be provided over the back surface of the first substrate body 111. In this case, the first substrate body may be provided with a through electrode. Alternatively, the first and second substrate bodies 111 and 121 may be each provided with an electrode pad and a through electrode.

In this embodiment, an example in which the first and second substrates each include transistors has been described. However, only one of the first and second substrates may include transistors. An example in which the transistors are planar transistors has been described. However, FinFET transistors or any other type of transistors may be provided. Alternatively, the transistors may include various transistors.

In this embodiment, an example in which the first and second interconnect layers each include single-level interconnects has been described. However, the first and second interconnect layers may be a multilayer interconnect layer including multilevel interconnects. The number of levels of each interconnect in the first interconnect layer may be different from that in the second interconnect layer.

In this embodiment, the size of the first electrodes 132 is equal to that of the third electrodes 142, and the size of the second electrodes 133 is equal to that of the fourth electrodes 143. However, this is merely an example of the present disclosure. The sizes of the first and second electrodes 132 and 133 may be different from those of the third and fourth electrodes 142 and 143, respectively. If a plurality of first electrodes 132, a plurality of second electrodes 133, a plurality of third electrodes 142, and a plurality of fourth electrodes 143 are provided, the electrodes may include one or more electrodes having a different size.

Figure 9:
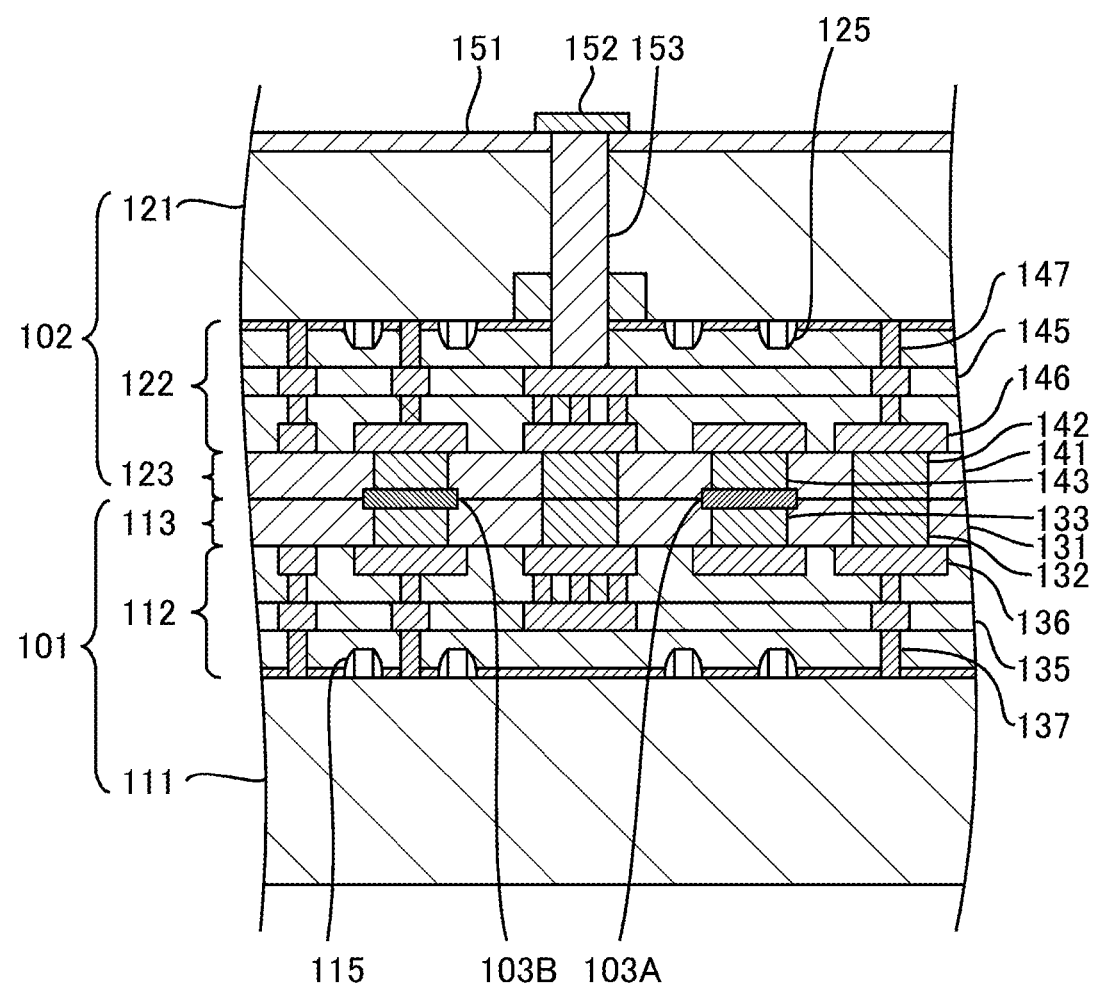
FIG. 9 is a cross-sectional view illustrating a semiconductor device according to a variation of the embodiment.

In this embodiment, an example in which a MIM capacitor element including a capacitor insulating film made of a high dielectric constant material, or a resistance element including a high-resistance metal film is formed as a passive element has been described. However, if a plurality of passive elements are provided, the passive elements may include one or more MIM capacitor elements and one or more resistance elements. In this case, as illustrated in FIG. 9, a functional film 103A made of a high dielectric constant material may be formed at the position at which a MIM capacitor element is to be formed, and a functional film 103B made of a high-resistance metal may be formed at the position at which a resistance element is to be formed. The functional films 103A and 103B do not need to have the same thickness. However, if the thicknesses of the functional films 103A and 103B falls within the range from 1 nm to 20 nm, elements are easily formed. In addition, each of the high dielectric constant material film and the high-resistance metal film is not limited to one type of film, and a plurality of types of high dielectric constant material films and a plurality of types of high-resistance metal films may be formed in accordance with the characteristics that the passive element needs to have. The functional films are not limited to the high dielectric constant material film and the high-resistance metal film, and may be films made of other materials. The passive elements are not limited to the two types of elements: the MIM capacitor element and the resistance element. A passive element except a MIM capacitor element and a resistance element may be provided, or a MIM capacitor element and/or a resistance element and a passive element except them may be mixed. For example, if the second electrodes are each displaced with respect to an associated one of the fourth electrodes, and are each connected thereto through a conductive film arranged in a loop pattern between the second and fourth electrodes, an inductor element can also be formed.

The semiconductor device according to the present disclosure and the method for fabricating the same are useful as, for example, a three-dimensional stacked semiconductor device and a method for fabricating the same, because additional process steps for forming a passive element can be minimized.

What is claimed is:

1. A semiconductor device comprising:
    a first substrate including a first substrate body, and a first surface layer that is provided over a principal surface of the first substrate body, and includes a first surface film, a first electrode having a first surface exposed at an outermost surface of the first surface film, and a second electrode having a second surface exposed at the outermost surface of the first surface film;
    a second substrate including a second substrate body, and a second surface layer that is provided over a principal surface of the second substrate body, and includes a second surface film, a third electrode having a third surface exposed at an outermost surface of the second surface film, and a fourth electrode having a fourth surface exposed at the outermost surface of the second surface film, where the second substrate is directly bonded to the first substrate such that the second surface layer is in contact with the first surface layer; and
    a functional film provided between the second surface of the second electrode and the fourth surface of the fourth electrode, wherein
    the outermost surface of the first surface film, the first surface of the first electrode and the second surface of the second electrode are planarized flush with each other,
    the outermost surface of the second surface film, the third surface of the third electrode and the fourth surface of the fourth electrode are planarized flush with each other,
    the first surface of the first electrode and the third surface of the third electrode are bonded together so as to be in contact with each other, and
    the second electrode, the functional film, and the fourth electrode constitute a passive element.

2. The semiconductor device of claim 1, wherein a size of the functional film in plan view is greater than each of a size, in plan view, of a portion of the second electrode exposed from the first surface film and a size, in plan view, of a portion of the fourth electrode exposed from the second surface film.

3. The semiconductor device of claim 1, wherein
    the functional film is an insulating film, and
    the second electrode, the functional film, and the fourth electrode constitute a capacitor element.

4. The semiconductor device of claim 3, wherein the functional film is made of $SiO_x$, $SiN_x$, $HfO_x$, or $HfSiO_x$.

5. The semiconductor device of claim 1, wherein
the functional film is a film made of a high-resistance metal, and
the second electrode, the functional film, and the fourth electrode constitute a resistance element.

6. The semiconductor device of claim 5, wherein the high-resistance metal is constantan, nickel silver, cobalt-tungsten-phosphorus, or nickel boron.

7. The semiconductor device of claim 1, wherein the first, second, third, and fourth electrodes are each made of aluminum, copper, nickel, or tungsten.

8. The semiconductor device of claim 1, wherein the first substrate includes a first through electrode passing through the first substrate body.

9. The semiconductor device of claim 1, wherein the second substrate includes a second through electrode passing through the second substrate body.

* * * * *